United States Patent [19]

Carelli et al.

[11] Patent Number: 4,789,825
[45] Date of Patent: Dec. 6, 1988

[54] INTEGRATED CIRCUIT WITH CHANNEL LENGTH INDICATOR

[75] Inventors: John A. Carelli, Allentown; Richard A. Pedersen, New Tripoli; Robert L. Pritchett, Bath, all of Pa.

[73] Assignee: American Telephone and Telegraph Co., AT&T Bell Laboratories, Murray Hill, N.J.

[21] Appl. No.: 161,304

[22] Filed: Feb. 25, 1988

Related U.S. Application Data

[63] Continuation of Ser. No. 863,094, May 14, 1986, abandoned.

[51] Int. Cl.[4] ............................................. G01R 31/26
[52] U.S. Cl. .................................... 324/158 T; 324/133
[58] Field of Search ............... 324/158 T, 158 R, 133; 340/653

[56] References Cited

U.S. PATENT DOCUMENTS

| | | | |
|---|---|---|---|
| 3,801,910 | 4/1974 | Quinn | 324/158 R X |
| 4,096,430 | 6/1978 | Waldron | 307/304 X |
| 4,278,988 | 7/1981 | Clifford et al. | 357/41 X |
| 4,305,011 | 12/1981 | Audaire et al. | 357/41 X |
| 4,346,344 | 8/1982 | Blauschild | 357/41 X |
| 4,454,467 | 6/1984 | Sakaguchi | 323/313 |

FOREIGN PATENT DOCUMENTS

| | | | |
|---|---|---|---|
| 54-121066 | 9/1979 | Japan | 324/158 T |
| 56-162064 | 12/1981 | Japan | . |
| 57-14757 | 1/1982 | Japan | . |
| 58-22425 | 2/1983 | Japan | 323/313 |

Primary Examiner—Jerry Smith
Assistant Examiner—Stephen M. Baker
Attorney, Agent, or Firm—James H. Fox

[57] ABSTRACT

An integrated circuit includes first and second field effect transistors having differing channel lengths, and a means for comparing the channel currents flowing therethrough. An excessive difference of currents indicates "short channel" effects, which can degrade performance. A signal flag indicating this condition may be provided to a test pad on the chip, or used to disable operation of the integrated circuit, or otherwise used to provide an indication.

9 Claims, 2 Drawing Sheets

INTEGRATED CIRCUIT WITH CHANNEL LENGTH INDICATOR

This is a continuation of application Ser. No. 863,094, filed May 14, 1986 and now abandoned.

BACKGROUND OF THE INVENTION

1. Field of the Invention

The present invention relates to an integrated circuit having means for determining whether the channel lengths of field effect devices are outside a given limit.

2. Description of the Prior Art

Integrated circuits having field effect transistors are designed to obtain a desired channel length (distance between the source and drain) for each transistor. In most cases, the transistors having the shortest channel lengths have the highest transconductance (Gm). In digital integrated circuits, these devices are usually the fastest devices in terms of switching speed, and they often determine the overall speed of the integrated circuit. Similarly, in analog integrated circuits, the shortest channel length devices often determine the highest frequency at which the integrated circuit will operate. Therefore, it is desirable to be able to design and fabricate integrated circuits having at least some field effect transistors with relatively short channel lengths.

One limitation on channel lengths is the so-called "short channel" effect, wherein the channel becomes so short that the gate electrode can not exercise proper control of the current flowing between the source and drain. In that case, a larger change in the gate voltage is necessary to effect a given change in the channel current; i.e., the transconductance is reduced. Of even more importance in many cases is the reduction in reliability due to "hot carriers" that often accompanies the short channel effect. The exact channel length at which the short channel effect occurs depends in part on the various integrated circuit process operations, which determine the doping levels, junction depths, gate insulator thicknesses (in the case of insulated gate field effect transistors), etc. In addition, there are inevitable variations in the lithography technique used to define the channel lengths. Therefore, a given integrated circuit may have an undesirably short channel length, due to the various uncontrolled process variations that occur from the fabrication of one integrated circuit to another.

In order to test for short channel effects, it is known to include on an integrated circuit wafer test transistors having a channel length as short as that of the shortest functional transistors. During the wafer probe test operation, it is known to measure the drain-to-source current as a function of gate voltage, in order to determine short channel effects. It is also known to measure the gain (beta) of a series of test transistors having differing design channel lengths. An excessive gain indicates that the actual channel lengths are less than the design value. However, the test transistors are located between the integrated circuit chips, and extra time for probing the test transistors must be provided. As a result, only a few (typically five in one current process) of the test transistors are measured per wafer, and even that results in substantial additional test time.

SUMMARY OF THE INVENTION

We have invented a technique whereby an integrated circuit chip includes test and reference transistors having differing channel lengths. A given absolute change in the channel lengths, as may be due to process variations, thus causes a different relative change for the test and reference transistors. This produces a difference in transistor operational characteristics, such as gain or channel current. A monitoring circuit responds to the difference, and if the difference is outside a desired limit, an indication is provided. The monitoring circuit may be on the same chip as the the test and reference transistors. In that case, the indication may be a voltage applied to a test pad or package terminal, or the disabling of a chip function, among other techniques.

DETAILED DESCRIPTION

Figure 1:
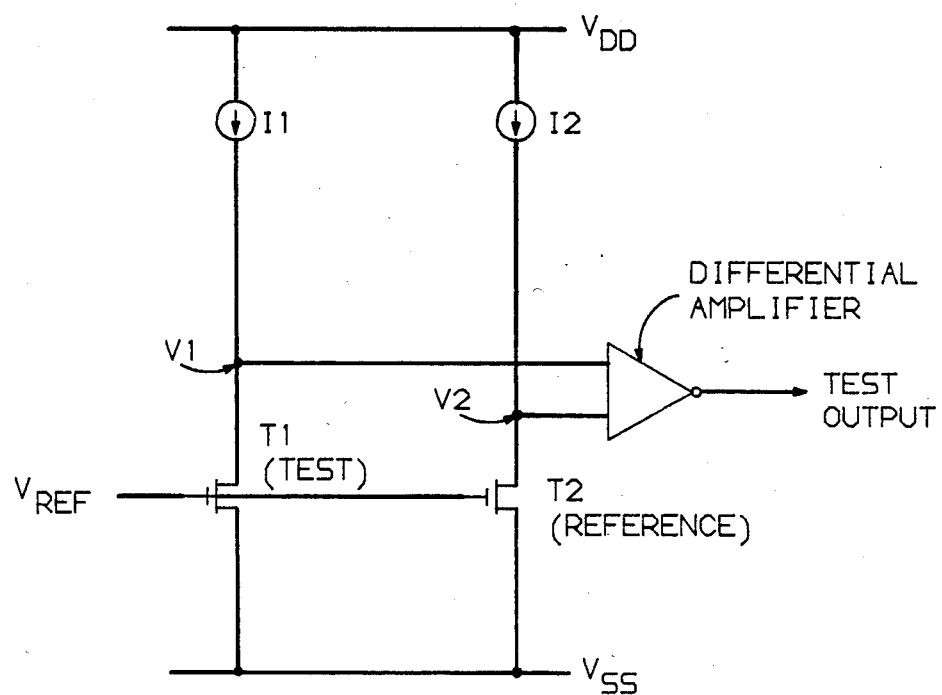
FIG. 1 shows a diagram of one embodiment of the present invention.

The following detailed description relates to an integrated circuit having channel length indicator means. The present technique allows for short channel effects to be determined for each chip on a wafer, if desired. Other channel length effects (e.g., long channels) may alternately or additionally be determined, as discussed further below. Referring to FIG. 1, there is provided on an integrated circuit chip a first field effect transistor T1 having a relatively short channel length (L1), and a second field effect transistors T2 having a relatively long channel length (L2). These devices are also referred to as the "test" and "reference" devices, respectively, herein. First and second current sources (I1 and I2) cause currents to flow through the channels of the two devices, respectively. As will be apparent, I1 and I2 need not be high impedance current sources, but may be simply bad devices, including, for example, resistors or diode-connected field effect transistors. A reference voltage ($V_{REF}$) is applied to the gates of the transistors. A differential amplifier amplifies the voltage developed between the drains of T1 and T2 (V1-V2) due to their channel currents.

The channel width of T1 is chosen to be larger than its channel length. Therefore, process variations that lead to a relatively large percentage variation in the "short" length L1 will produce a relatively smaller percentage variation in its channel width W1. For example, if L1 has a design value of 1 $\mu$m and W1 has a design value of 10$\mu$m, a reduction of 0.1$\mu$m due to process variations produces a relatively large (10 percent) change in L1, but a relatively smaller (1 percent) change in W1. Thus, the length-to-width ratio (L1/W1) of T1 will change about 10 percent. As is well known in the art, the ratio of length to width influences the gain of the device, and hence channel current flowing therethrough. Thus, the above-noted change will increase the gain, typically also about 10 percent, and allow significantly more channel current to flow through T1 for a given gate-to-source voltage. The device T2 is designed to have a channel length L2 and a channel width W2 that are large compared to L1, and hence also change a relatively small percentage for a given change in channel dimensions due to process variations. For example, if L2 is 10 $\mu$m and W2 is 100 $\mu$m, then the above-noted 0.1 $\mu$m reduction produces only a 1 percent and 0.1 percent change, respectively. Similarly, the ratio L2/W2 changes only about 1 percent, with correspondingly small changes in the gain and current flow through T2. Hence, T2 serves as a reference transistor, for providing a channel current for comparison with that of T1.

The circuit of FIG. 1 is one method of detecting relative changes in the length-to-width ratios of T1 and T2, with other techinques being possible. The current sources I1 and I2 are typically chosen to produce currents through T1 and T2 that cause equal voltages V1 and V2 to appear on their respective drains, when the channel length of T1 is at its nominal design value. The differential amplifier produces a given test output voltage level (e.g., high) when V1 is greater or equal to V2, which is the case when the channel length of T1 is greater than a desired minimum level. However, when the channel length of T1 becomes excessively short (as due to process deviations from the nominal value), then the voltage V1 is reduced. The amplifier detects the difference between V1 and V2, and signals this condition (as by a low test output voltage level). For convenience of circuit design, the gains of T1 and T2 are typically chosen to be equal when the test transistor has a channel length equal to its minimum allowed design value. In that case, the current sources are typically designed to produce equal currents; i.e., I1=I2, and then V1 will equal V2 under nominal conditions. However, non-equal nominal gains for T1 and T2 may be chosen, with the values of I1 and I2 then being adjusted accordingly to produce equal drain voltages V1 and V2 under nominal conditions. Alternately, it is possible to design a comparator circuit that accounts for the different voltage levels (V1 and V2) that unequal gains of the test and reference transistors produce. As noted above, the gain of a field effect transistor is influenced by the channel length-to-width ratio, which may be adjusted to obtain the desired gains.

Figure 2:
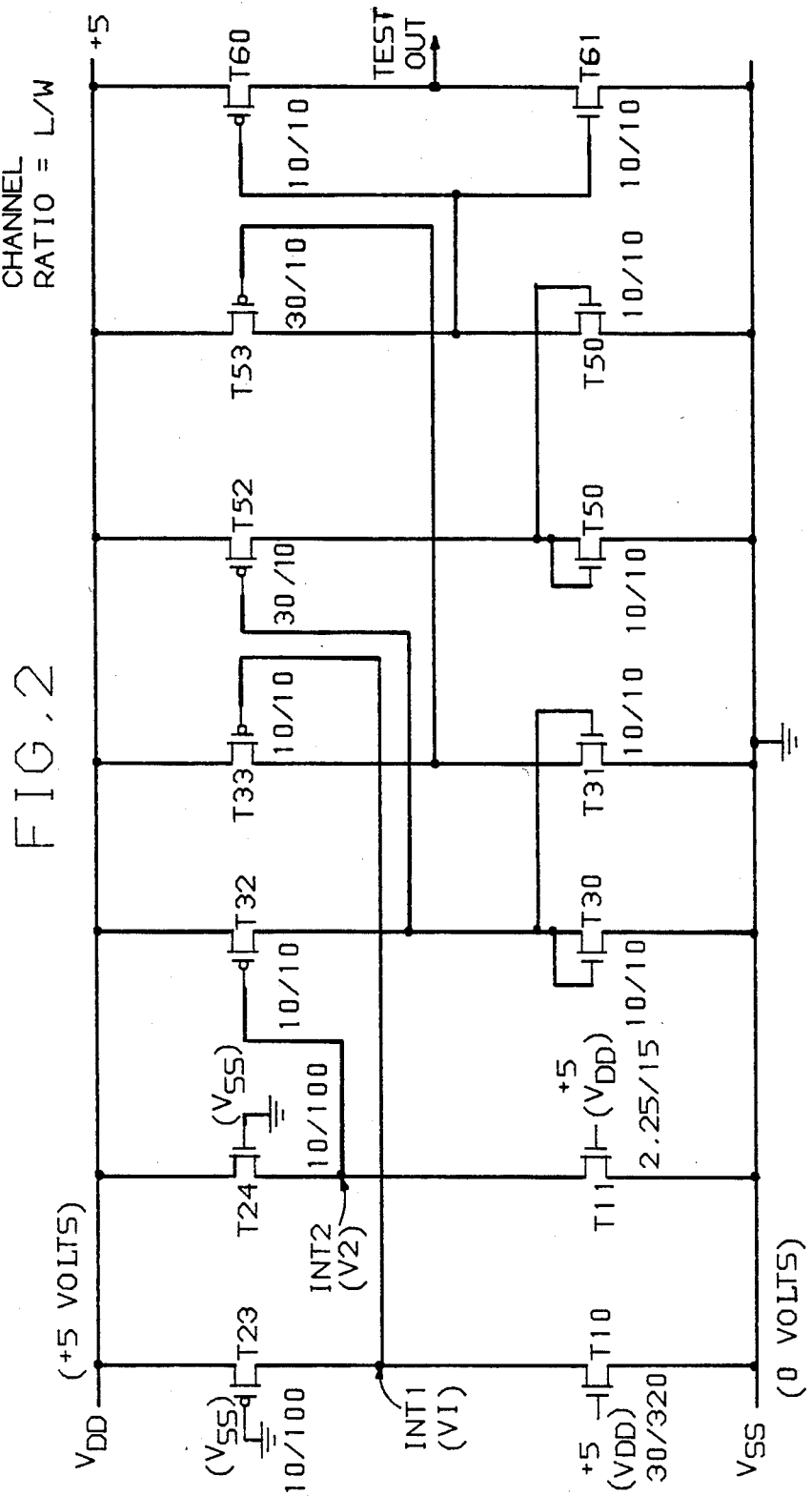
FIG. 2 shows schematically an illustrative circuit implementation of the present invention.

A typical circuit that implements the present technique is shown in FIG. 2, wherein all of the circuitry is typically included on the same chip. For each transistor, the channel length and width is given as L/W, where L is the actual length after dopant diffusion (frequently referred to as L' in the art). Transistor T11 is the test transistor, and T10 is the reference transistor. Transistors T23 and T24 are load transistors that are sized to cause equal currents to flow through T10 and T11 when the latter are at their nominal channel sizes. Furthermore, the bias voltage and channel current of T10 and T11 in this embodiment are chosen to place them in the linear portion of their operational characteristics. It is alternately possible to design circuitry that operates with the test and reference transistors operating in the saturated region. The voltage difference across nodes INT1 and INT2 (V1–V2) is then amplified by differential circuitry comprising T30–T61, and the output signal appears at node OUT. This circuitry causes node OUT to be at a high (5 volt) voltage state when the channel current through T11 is less than through T1D, indicating that the channel length of T11 is not excessively short, and that the chip is "good". The node OUT is placed at a low (0 volt) voltage state when the channel current through T11 is greater than through T10, indicating that the channel length of T11 is less than the minimum desired value, and thus the chip is "bad". The $V_{DD}$ voltage for the test circuit may be provided through a separate pad that is powered up only during the probe testing of the chip, to save on power dissipation during chip operation.

The test output signal from the amplifier may be provided to a test pad that is probed at the same time that the chip on which it is located is tested during the wafer probe test. Hence, no additional probe head movement is necessary to access the test pad, and the present technique provides a very rapid "good" or "bad" indication for each chip. Other methods of accessing the test output signal may be used. For example, the test output signal may be used to cause the chip to stop functioning wholly or in part, which would then cause the chip to fail a conventional functionality test without even requiring a separate test pad for the test output signal. A simple method of accomplishing this is to supply the test signal to an "AND" logic gate that controls a chip function, or an input or output signal path. Alternately, the test output signal may control additional current leakage on an input terminal, causing a conventional current leakage test to fail for the appropriate test output signal condition.

Another technique is to activate the present test means at a power supply voltage not encountered in normal operation. For example, at a low voltage (e.g., 3.0 volts) the present circuit may be activated, and the test output signal supplied to a convenient terminal or pad. The test circuit is then deactivated at higher voltages (e.g., >4.5 volts) used for other tests, and also for actual operation of the circuit. Another technique is to include a light sensitive detector on the chip, and to activate the test circuit only when light (as from a light emitting diode, laser, or other source) is directed at the chip. The circuit then remains deactivated when the chip is packaged. Note that these latter two techniques also allow for removal of the $V_{DD}$ power supply voltage to the present test circuits during the normal operation of the chip. Hence, the test circuit then consumes no power in actual chip operation, without the necessity of providing a separate pad for the supplying $V_{DD}$ voltage to the test circuit only during the test. Still other techniques for providing access to the test output signal, and activating the test circuit, may be envisioned. It is apparent that the present technique may provide the test indication after the chip is packaged, in lieu of, or in addition to, providing the indication prior to packaging. Then, physical effects that may lead to short channel effects during the operational lifetime of the integrated circuit may be monitored.

Although the foregoing has described the present technique in terms of monitoring short channel effects, other channel length effects may be determined. For example, the channel length of the test transistor may be designed to be longer than the channels of at least some of the functional transistors on the chip. The test output signal may then normally be in the "good" state if the actual channel length of the test transistor is less than a desired limit, and be in the "bad" state if the channel length is greater than the desired limit. This gives, for example, an indication that the chip will be slower in operation than chips having the nominal channel lengths. This indication may thus be useful for binning parts having different performance specifications. It is also apparent that more than one test transistor, each having a different channel length, may be included on a chip for monitoring different limits on either the lower or upper side of the nominal channel length.

The amplifier circuitry included in FIG. 2 is desirably included on the same integrated circuit as the test and reference transistors, to make matching of transistor characteristics more reliable. However, some or all of it may be located externally to the integrated circuit. For example, it is possible to include only the test and reference transistors on the integrated circuit being tested, with all of the amplifier circuitry being external thereto. This provides a saving of space on the integrated circuit under test, but makes matching of the gains and other characteristics of the various transistors more difficult. Still other types of monitoring circuitry is possible. For example, a voltage source may be applied to the drains of the test and reference transistors, with current sensitive circuitry then being used (in lieu of voltage sensitive circuitry as shown) to compare the channel currents through the test and reference transistors.

What is claimed is:

1. An integrated circuit comprising a plurality of field effect transistors, characterized in that said integrated circuit comprises:

a test field effect transistor (T1) having a test channel length (L1) and a reference field effect transistor (T2) having a reference channel length (L2) that is large compared to said test channel length, whereby fabrication variations that cause a change in the channel lengths produce a relatively large change in the gain of said test transistor as compared to the change in the gain of said reference transistor;

means adapted to cause a current to flow through the channels of said test and said reference transistors;

and a comparator having first and second inputs coupled to said test and reference transistors, respectively, whereby said comparator produces a test signal having a first output voltage state when said test channel length is less than a given amount, and a second output voltage state when said test channel length is greater than said given amount, whereby the output voltage state of said compara-tor is determined by the fabrication of said integrated circuit.

2. The integrated circuit of claim 1 wherein said comparator comprises a differential amplifier also located on said integrated circuit that amplifies the difference in the drain-to-source voltages (V1, V2) between said test and reference transistors.

3. The integrated circuit of claim 1 wherein said means adapted to cause a current to flow comprises first and second load transistors located on said integrated circuit, with each load transistor connected between the drains of said test and reference transistors and a conductor adapted to supply a power supply voltage.

4. The integrated circuit of claim 1 wherein said test transistor has a nominal channel length equal to that of the transistors having the shortest nominal channel lengths on said integrated circuit.

5. The integrated circuit of claim 1 wherein said test signal is coupled to at least one test pad on said integrated circuit.

6. The integrated circuit of claim 1 wherein said test signal disables the functioning of at least a portion of said integrated circuit.

7. The integrated circuit of claim 1 wherein said test signal is adapted to control the voltage or current flow characteristics of a terminal of said integrated circuit.

8. The integrated circuit of claim 1 wherein said test field effect transistor and said reference field effect transistor are enhancement mode field effect transistors.

9. The integrated circuit of claim 1 wherein said test signal is coupled to a terminal of said integrated circuit that is used in the operation of said integrated circuit.

* * * * *